United States Patent [19]
Davies et al.

[11] Patent Number: 6,094,072
[45] Date of Patent: Jul. 25, 2000

[54] METHODS AND APPARATUS FOR BIPOLAR ELIMINATION IN SILICON-ON-INSULATOR (SOI) DOMINO CIRCUITS

[75] Inventors: Andrew Douglas Davies; Salvatore N. Storino; Jeff V. Tran; Robert Russell Williams, all of Rochester, Minn.

[73] Assignee: International Business Machines Corporation, Armonk, N.Y.

[21] Appl. No.: 09/268,923

[22] Filed: Mar. 16, 1999

[51] Int. Cl.[7] .................. H03K 19/096; H03K 19/094; H03K 19/20; H03K 19/003

[52] U.S. Cl. ................. 326/98; 326/15; 326/119

[58] Field of Search ................ 438/155, 309; 257/347, 534; 326/98, 121, 119, 93, 95, 112, 113, 15, 82, 83, 86

[56] References Cited

U.S. PATENT DOCUMENTS

| | | | |
|---|---|---|---|
| 5,146,115 | 9/1992 | Benhamida | 326/95 |
| 5,204,562 | 4/1993 | Pace | 327/382 X |
| 5,440,243 | 8/1995 | Lyon | 326/33 |
| 5,483,181 | 1/1996 | D'Souza | 326/98 |
| 5,594,371 | 1/1997 | Douseki | 326/119 |
| 5,686,735 | 11/1997 | Sim | 257/24 |
| 5,774,411 | 6/1998 | Hsieh et al. | 365/230.06 |
| 5,859,547 | 1/1999 | Tran et al. | 326/95 X |

OTHER PUBLICATIONS

Research Disclosure, "Pre–Discharge Technique to Improve Noise Immunity on Silicon–on–Insulator (SOI) Domino Circuits", by Anonymous, Apr. 1998, pp. 496–497.

*Primary Examiner*—Michael Tokar
*Assistant Examiner*—Patrick Wamsley
*Attorney, Agent, or Firm*—Joan Pennington

[57] ABSTRACT

In brief, methods and apparatus are provided for bipolar elimination in silicon-on-insulator (SOI) domino circuits. Apparatus for bipolar elimination in silcon-on-insulator (SOI) domino circuit includes a domino silicon-on-insulator (SOI) field effect transistor. An input is coupled to the domino silicon-n-insulator (SOI) field effect transistor. A predischarging device is coupled to said domino silicon-on-insulator (SOI) field effect transistor. The predischarging device is activated during a precharge mode of the domino circuit, so that the SOI parasitic bipolar transistor is not activated. A dynamic input circuit couples the input to the domino silicon-on-insulator (SOI) field effect transistor. The output of the dynamic input circuit is low during the precharge mode. The output of the dynamic input circuit corresponds to the input during the evaluate mode. The output of the dynamic input circuit is used to gate the predischarging device.

12 Claims, 6 Drawing Sheets

METHODS AND APPARATUS FOR BIPOLAR ELIMINATION IN SILICON-ON-INSULATOR (SOI) DOMINO CIRCUITS

FIELD OF THE INVENTION

The present invention relates to methods and apparatus for bipolar elimination in silicon-on-insulator (SOI) domino circuits.

DESCRIPTION OF THE PRIOR ART

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

Complementary metal oxide semiconductor (CMOS) compound domino logic (CDL) circuits or domino circuits are known. CMOS domino circuits provide a logical function, such as a NOR function or a NAND function, providing a logical output signal responsive to a plurality of input signals. Many domino circuits Include a P-channel field effect transistor that is clocked to precharge an intermediate node causing the output to go to a predetermined logic state.

As shown in FIG. 1. SOI semiconductors include a thin layer of silicon placed on top of an insulator, such as silicon dioxide ($SiO_2$) or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. With SOI technology faster MOS transistors can be manufactured resulting in higher performance semiconductors for faster electronic devices.

Referring to FIGS. 1 and 2, there is shown the SOI FET and the parasitic bipolar device. A problem called bipolar discharge exists with SOI FETs. An inherent drawback of placing a MOS transistor on top of a SOI layer is that the MOS transistor is actually placed in parallel with a bipolar junction transistor, as illustrated in FIG. 2. If enough current is passed through the MOS transistor, the parasitic bipolar transistor will turn on. This causes the unwanted effect called bipolar discharge and lowers the performance of the MOS transistor.

Normally, parasitic bipolar action does not manifest itself in conventional, bulk, NMOS transistors because the base of the bipolar transistor is always kept at ground potential, keeping the bipolar transistor turned off. In the SOI FET, the body (B) of the MOS FET device, or base of the bipolar transistor, is floating and can be charged high by junction leakages induced when both drain (D) and source (S) terminals of the MOS FET are at a high potential. Subsequently, if the source (S) is pulled to a low potential, the trapped charge in the base area (B) is available as parasitic base current. The parasitic base current activates the bipolar transistor and generates a collector current at the drain terminal of the MOS FET. This collector current flow in the bipolar junction transistor or bipolar discharge is undesirable since it causes an unintended loss of charge on the drain node of a dynamic circuit. Such bipolar discharge reduces the performance of the MOS SOI FET device and can result in the functional failure of the dynamic circuit causing the logic circuit to output a wrong value.

High speed CMOS circuits often employ a domino circuit technique that utilizes pre-charging to improve the gate speeds of the transistors. Circuit nodes are pre-charged during each clock cycle to a certain level. The problem with SOI FETs is that the parasitic bipolar transistor can cause bipolar discharge of pre-charged circuit nodes.

A need exists to eliminate the effect of parasitic bipolar transistors or for bipolar elimination in precharged SOI domino circuits.

SUMMARY OF THE INVENTION

A principal object of the present invention is to provide improved silicon-on-insulator (SOI) domino circuits. Other objects are to provide such SOI domino circuits substantially without negative effects and that overcomes many of the disadvantages of prior art arrangements.

In brief, methods and apparatus are provided for bipolar elimination in silicon-on-insulator (SOI) domino circuits. Apparatus for bipolar elimination in silicon-on-insulator (SOI) domino circuit includes a domino silicon-on-insulator (SOI) field effect transistor. An input is coupled to the domino silicon-on-insulator (SOI) field effect transistor. A predischarging device is coupled to said domino silicon-on-insulator (SOI) field effect transistor. The predischarging device is activated during a precharge mode of the domino circuit, so that the SOI parasitic bipolar transistor is not activated.

In accordance with features of the invention, a dynamic input circuit couples the input to the domino silicon-on-insulator (SOI) field effect transistor. The output of the dynamic input circuit is low during the precharge mode. The output of the dynamic input circuit corresponds to the input during the evaluate mode. The output of the dynamic input circuit is used to gate the predischarging device.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
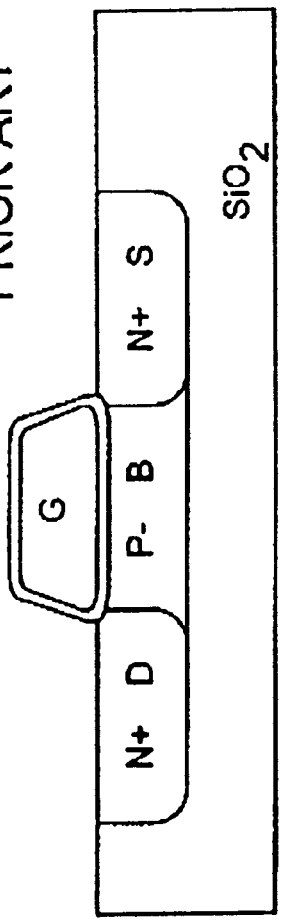
FIG. 1 is a cross sectional view illustrating a conventional silicon-on-insulator (SOI) N-channel field effect transistor (NFET)
Figure 2:
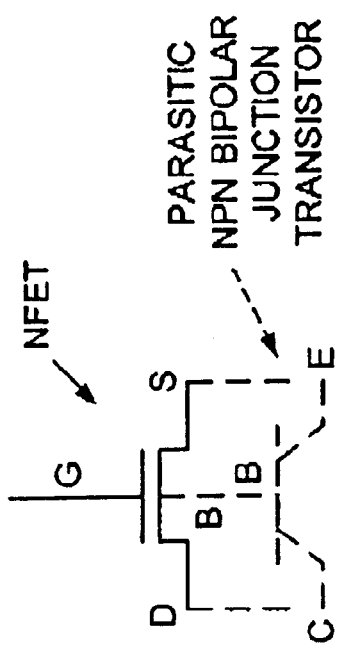
FIG. 2 is a schematic diagram illustrating the conventional silicon-on-insulator (SOI) N-channel field effect transistor (NFET) of FIG. 1 including a bipolar junction transistor.
Figure 3:
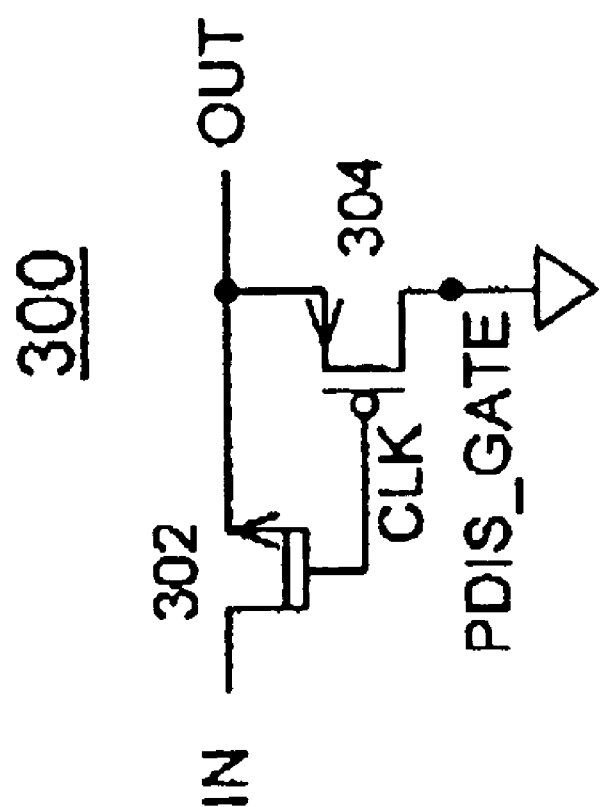
FIG. 3 is a schematic diagram illustrating a predischarged dynamic gate circuit of the preferred embodiment.
Figure 4:
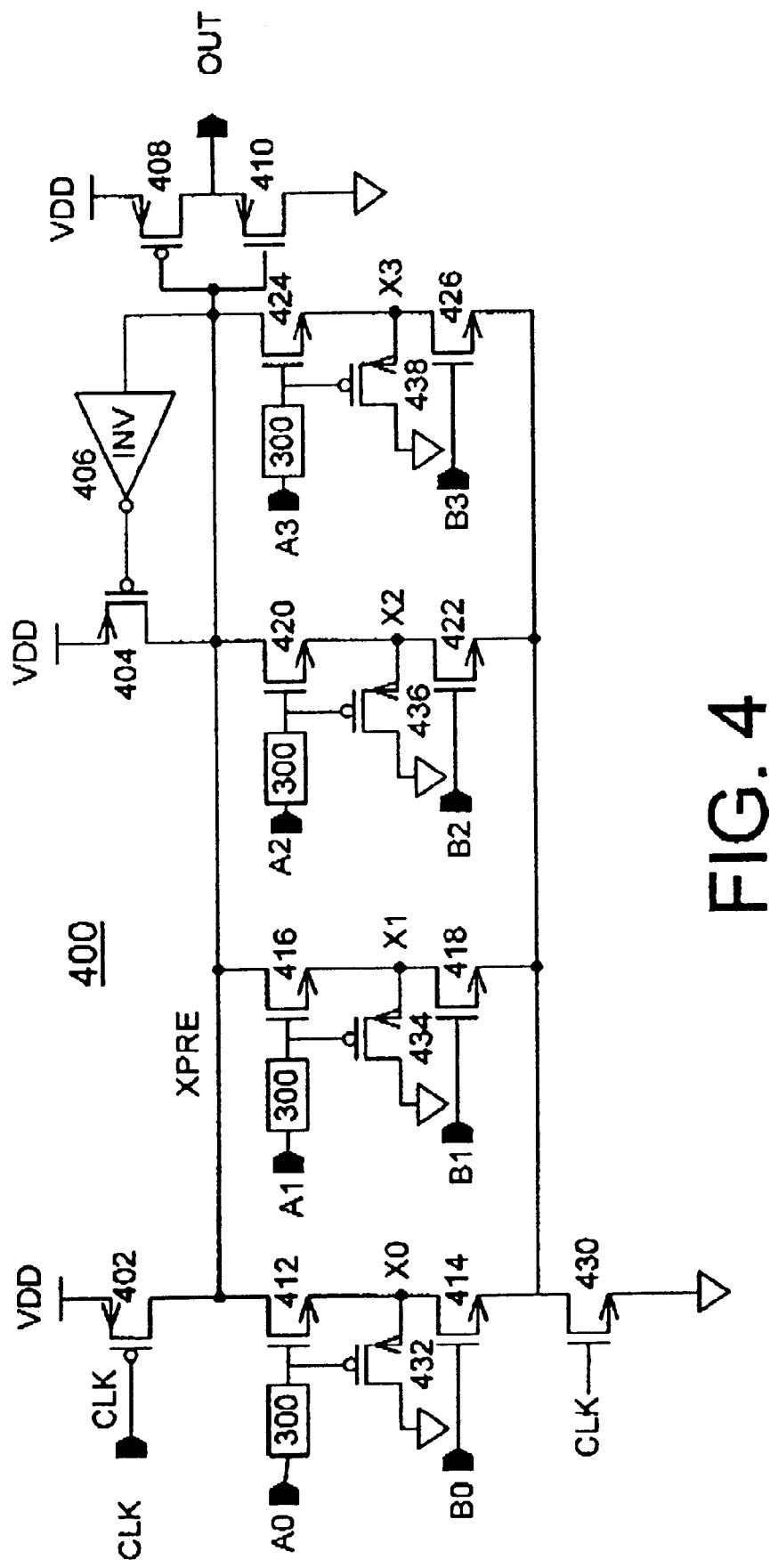
FIG. 4 is a schematic diagram illustrating the predischarged dynamic gate circuit of FIG. 3 provided for bipolar elimination in silicon-on-insulator (SOI) domino circuits of the preferred embodiment.

Having reference now to the drawings, in FIG. 3, there is shown a predischarged dynamic gate circuit generally designated by the reference character 300 of the preferred embodiment. FIG. 4 illustrates the predischarged dynamic gate circuit 300 used for bipolar elimination in a silicon-on-insulator (SOI) domino circuit generally designated by the reference character 400 of the preferred embodiment.

Predischarged dynamic gate circuit 300 includes a N-channel field effect transistor (NFET) 302 and a P-channel field effect transistor (PFET) 304. A low CLK signal turns off the clock gated NFET 302 and turns on PFET 304. A high CLK signal turns on the clock gated NFET 302 and turns off PFET 304. When the CLK signal is low, the OUT signal of predischarged dynamic gate circuit 300 is LOW regardless of the IN signal. When the CLK signal is high, the OUT is equal to the IN signal.

In FIG. 4, the silicon-on-insulator (SOI) domino circuit includes a clocked, precharge P-channel field effect transistor (PFET) 402 and a second PFET 404 respectively coupled between a supply voltage VDD and a precharge node XPRE. An inverter 406 is coupled between the precharge node XPRE and the gate of PFET 404. The gate of PFET 402 receives a clock signal CLK. The source of the PFETs 402, 404 is connected to the positive supply rail VDD. The drain of the PFETs is connected to the precharge node XPRE. The precharge PFET 402 is turned on with low clock cycles to precharge the precharge node XPRE to a high or one level during the precharge mode. The precharge PFET 402 is turned off with high clock cycles during the evaluate mode. Domino circuit includes a PFET 408 and an N-channel FET (NFET) 410 connected between the supply rail VDD and ground. The precharge node XPRE is connected to the gates of the PFET 408 and NFET 410. The connection of the respective drain and source of the PFET 408 and NFET 410 provides the output of the SOI domino circuit at a line labeled OUT.

Domino circuit includes a plurality of stacks of series connected NFETs 412, 414; 416, 418; 420, 422; and 424, 426 between the precharge node XPRE and a source node NCLK of a clocked NFET 430. A respective pre-discharged PFET 432, 434, 436, and 438 is connected between ground and the source and drain connection of the respective series connected NFETs 412, 414; 416, 418; 420, 422; and 424, 426 or nodes labeled X0, X1, X2, and X3. The pre-discharged PFETs 432, 434, 436, and 438 are gated by the output of a respective predischarged dynamic gate circuits 300 coupling inputs A0, A1, A2, and A3. The purpose of the pre-discharged PFETs 432, 434, 436, and 438 is to eliminate the bipolar discharge problem in the SOI NFET.

In accordance with features of the invention, the bipolar parasitic problem is eliminated by making certain that the SOI bipolar device never turns on. The circuits of the preferred embodiment ensure that there is never enough voltage on the base of this parasitic transistor to allow it to turn on. Discharging particular diffusions to ground utilizing the pre-discharged PFETs 432, 434, 436, and 438 guarantees that sufficient base voltage will not exist. The pre-discharged PFETs 432, 434, 436, and 438 are turned on during the precharge mode with the CLK is low.

During the pre-charge phase the input CLK is active low, then node XPRE is charged high. During the precharge phase, all inputs provided by the output of the predischarged dynamic gate circuits 300 are low. So during the pre-charge phase PFETs 432, 434, 436, and 438 are active discharging nodes X0, X1, X2, and X3 to a P-channel threshold voltage above ground. As a result, the body voltages of NFETs 412, 416, 420 and 420 cannot get sufficiently high to activate the corresponding parasitic bipolar NPN transistors of NFETs 412, 416, 420 and 420. As a result, the node XPRE is protected from unintended discharge.

Figure 5:
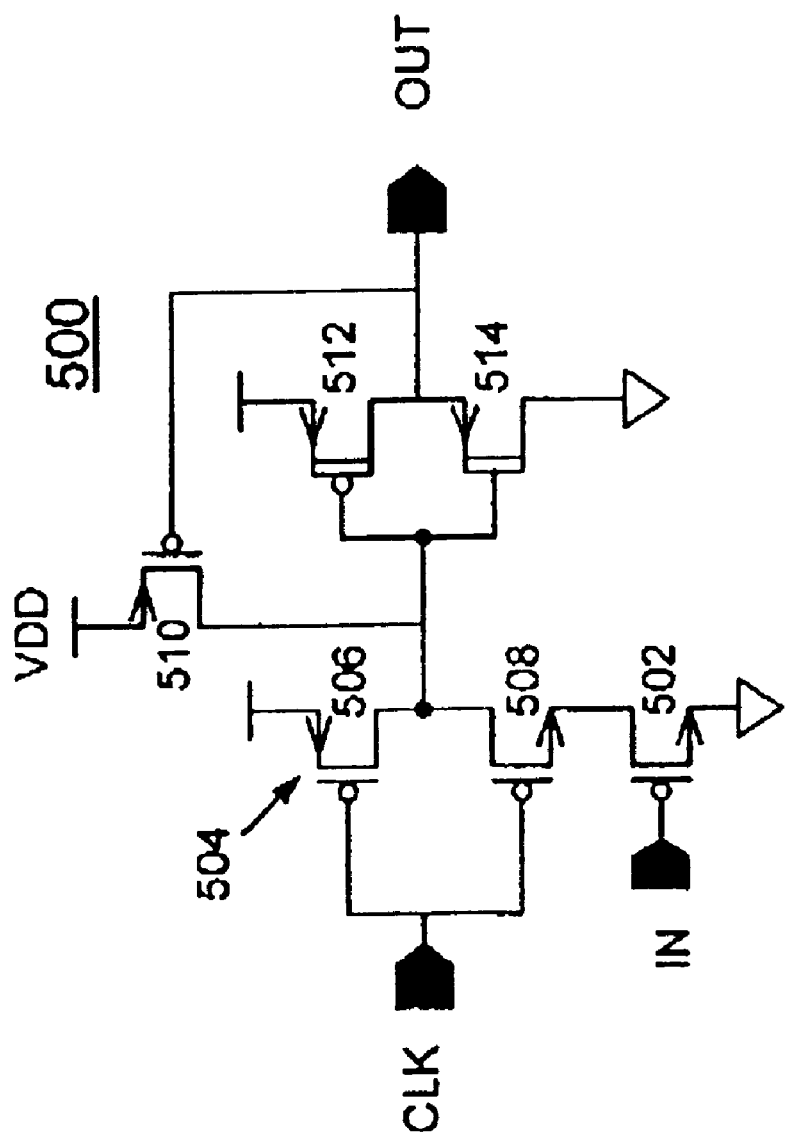
FIG. 5 is a schematic diagram illustrating a dynamic buffer circuit of the preferred embodiment.
Figure 6:
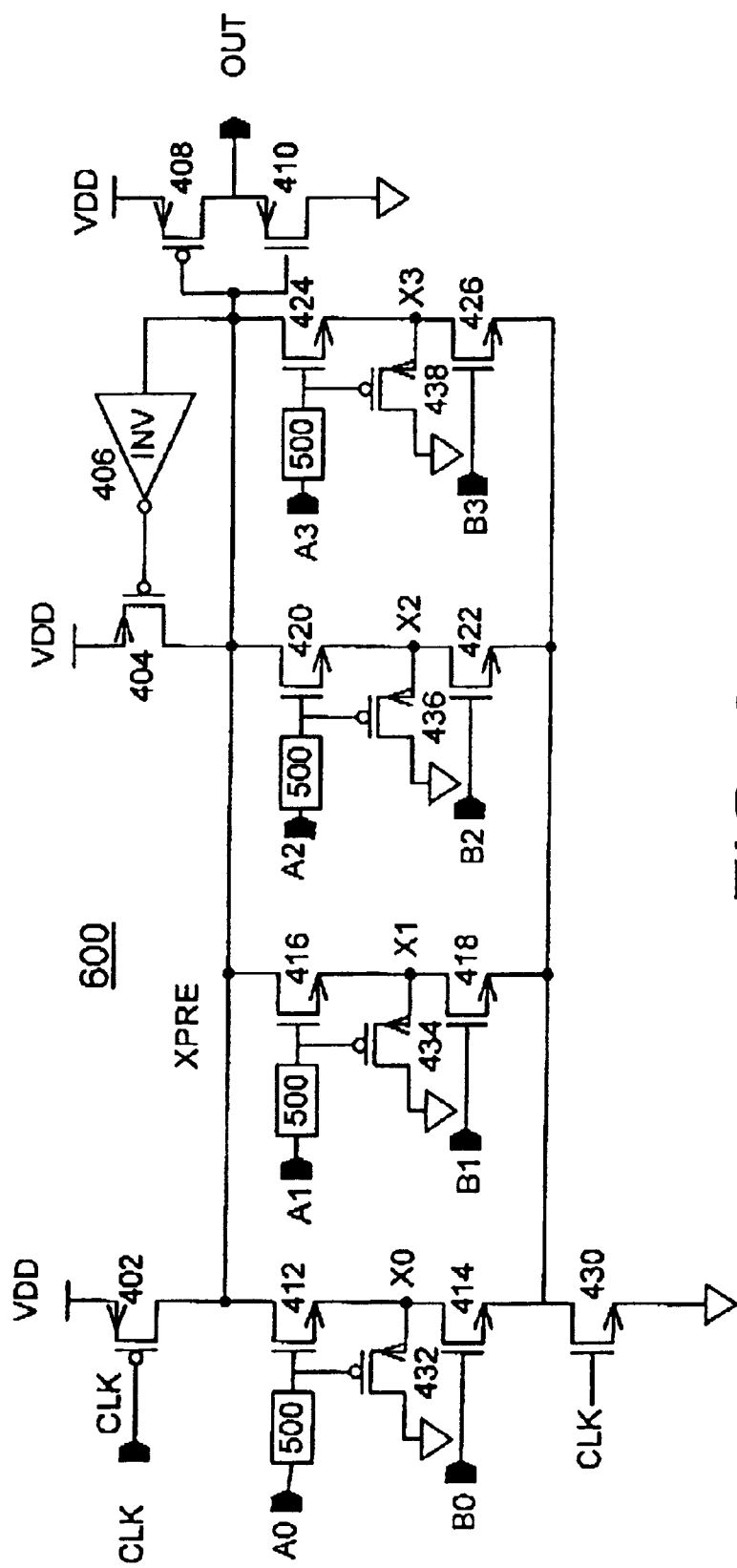
FIG. 6 is a schematic diagram illustrating the predischarged dynamic buffer circuit of FIG. 5 provided for bipolar elimination in silicon-on-insulator (SOI) domino circuits of the preferred embodiment.

Referring to FIG. 5, there is shown a dynamic buffer circuit generally designated by the reference character 500 of the preferred embodiment. FIG. 6 illustrates the dynamic buffer circuit 500 utilized for bipolar elimination in silicon-on-insulator (SOI) domino circuit 600 of the preferred embodiment. The predischarged dynamic gate circuit 300 works in a very similar way as the dynamic buffering circuit 500 to solve the similar problems. In FIG. 6 the same reference numbers used in SOI domino circuit 400 are used for similar or identical components of the SOI domino circuit 600.

Dynamic buffering circuit 500 similarly addresses the case of an input coming from a non-domino logic block and which might be high during the domino circuit precharge phase. Dynamic buffering circuit 500 is arranged as a domino block where the input of concern comes in to a lower NFET device 502 In an evaluate stack 504 of the new domino block. Since dynamic buffering circuit 500 is a domino circuit, its output will be low or at a downlevel during precharge. Evaluate stack 504 includes a clocked PFET 506 AND NFET 508 connected in series with input gated NFET 502 between the supply voltage VDD and ground. A precharge PFET 510 is connected between a precharge node PRE. Dynamic buffering circuit 500 includes a PFET 512 and an N-channel FET (NFET) 514 connected between the supply rail VDD and ground. The precharge node PRE is connected to the gates of the PFET 512 and NFET 514. The connection of the respective drain and source of the PFET 512 and NFET 514 provides the output of the dynamic buffering circuit 500.

When CLK=0, the Dynamic Buffer circuit 500 stops the IN signal from passing through, and forces the OUT signal to be low. However, when CLK=1, OUT signal will be equivalent to the IN signal. Since all input signals to domino gate are treated to be don't care during precharge state, when CLK=0, adding dynamic buffer circuit 500 in front of the circuit is a solution to solve this problem. All input signals are now forced to be low during pre-charge which enables or turns on discharged devices PFETs 432, 434, 436 and 438 during precharge state.

Figure 7:
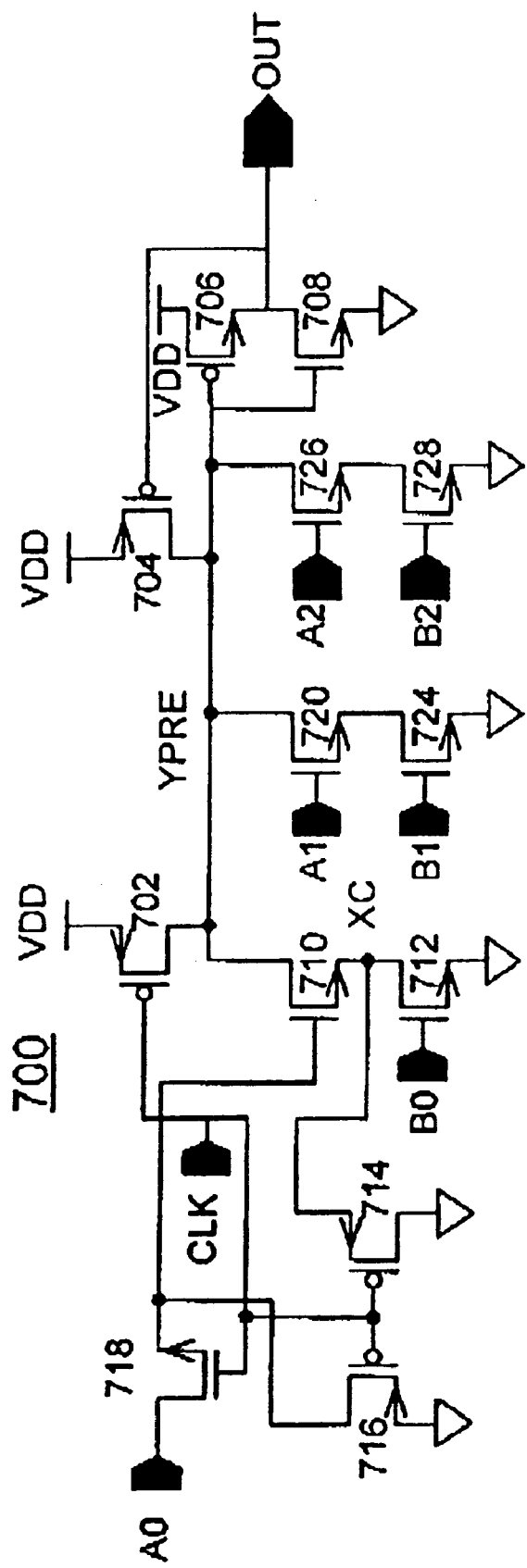
FIG. 7 is a schematic diagram illustrating another dynamic logic circuit for bipolar elimination in silicon-on-insulator (SOI) domino circuits of the preferred embodiment.

FIG. 7 illustrates an alternative SOI domino circuit generally designated by the reference character 700 of the preferred embodiment. SOI domino circuit 700 has fewer transistors and is slightly faster than the SOI domino circuits 400 and 800. SOI domino circuit includes a pair of precharge PFETs 702 and 704 coupled between a supply rail VDD and a precharge node YPRE. A PFET 706 and an NFET 708 having their gates connected to the precharge node YPRE are connected between VDD and ground. PFET 706 and NFET 708 provide the output of SOI domino circuit 700 indicated at a line labeled OUT.

FIG. 7 shows how a node XC of concern at the connection of source of NFET 710 and drain of NFET 712 for bipolar parasitic is discharged by a PFET 714, thus eliminating the bipolar parasitic threat. PFET 716 will always pull down the gate of the top evaluation NFET 710 during precharge, eliminating sneak paths. NFET 718 is a "pass gate" that is disabled during precharge but passes the A0 input which comes from non-domino logic and could be high or low only during the evaluate phase of the clock. Preferably NFET 718 is a low threshold FET, but since this input does not drive a ratioed circuit, it does not matter if the passed signal only reaches VDD minus the threshold voltage Vt of NFET 718. SOI domino circuit 700 only uses three FETs 714, 716 and 718 and the only delay is passing A0 through the pass gate NFET 718. The input circuit formed by FETs 714, 716 and 718 is only needed for inputs to precharged domino circuitry that are not guaranteed to be downlevel during precharge. Inputs to evaluate stacks formed by NFETs 720, 724, 726 and 728 may be from domino logic and are low during the precharge phase.

In FIG. 7, A0 was used as an example with the bipolar elimination input circuitry 700 of the preferred embodiment, but any or all of the inputs A0, A1, A2 can use this technique. It should be understood that the dynamic gate 300 and the dynamic buffer circuit 500 can be with any or all of the inputs A0, A1, A2, A3 that are not guaranteed to be downlevel during precharge.

It should be understood that NFETs with an inverted clock applied on their gates can be used Instead of PFETs 714 and 716. In fact a safer design results if an NFET is used for PFET 716 as to guarantee that the gate of NFET 718 is held solidly at ground instead of a threshold above ground. Note that if A0 is a low or downlevel, it will quickly be brought down to ground during evaluate, when the CLK goes high again. A low threshold PFET for PFET 716 is a prudent device to use as the threshold of the low threshold PFET 716 would be less than the normal threshold of NFET 718. Either an NFET and PFET can be used for PFET 714 since a small voltage at the source of NFET 718 would not create a bipolar parasitic problem.

It should be understood that principles of the present invention apply to domino logic circuits formed of PFETs.

While the present Invention has been described with reference to the details of the embodiments of the invention shown in the drawing, these details are not intended to limit the scope of the invention as claimed in the appended claims.

What is claimed is:

1. A method for bipolar elimination in silicon-on-insulator (SOI) domino circuit comprising the steps of:

providing a discharging device coupled to a domino SOI field effect transistor;

coupling an input to said domino SOI field effect transistor through a dynamic circuit; and activating said discharging device during a precharge mode of the domino circuit utilizing an output of said dynamic circuit to activate said discharging device, said dynamic circuit providing a low output during said precharge mode and said dynamic circuit providing an output corresponding to said input during an evaluate mode.

2. The method for bipolar elimination in silicon-on-insulator (SOI) domino circuit as recited in claim 1 includes the step of providing a dynamic gate circuit for said dynamic circuit.

3. The method for bipolar elimination in silicon-on-insulator (SOI) domino circuit as recited in claim 2 includes the step of providing said dynamic gate circuit formed by a pair of field effect transistors, one gated field effect transistor of said pair of field effect transistors connecting between said input and said domino SOI field effect transistor.

4. The method for bipolar elimination in silicon-on-insulator (SOI) domino circuit as recited in claim 3 includes the step of providing another field effect transistor of said pair of field effect transistors for discharging said gated field effect transistor.

5. The method for bipolar elimination in silicon-on-insulator (SOI) domino circuit as recited in claim 1 includes the step of providing a dynamic buffer circuit for said dynamic circuit.

6. The method for bipolar elimination in silicon-on-insulator (SOI) domino circuit as recited in claim 5 includes the step of providing a dynamic buffer circuit for said dynamic circuit; said dynamic buffer circuit comprising a domino logic block.

7. Apparatus for bipolar elimination in silicon-on-insulator (SOI) domino circuit comprising:

a domino silicon-on-insulator (SOI) field effect transistor;

an input coupled to said domino silicon-on-insulator (SOI) field effect transistor through a dynamic circuit; and a predischarging device coupled to said domino silicon-on-insulator (SOI) field effect transistor; said predischarging device being activated during a precharge mode of said domino circuit utilizing an output of said dynamic circuit to activate said predischarging device, said dynamic circuit providing a low output during said precharge mode and said dynamic circuit providing an output corresponding to said input during an evaluate mode.

8. Apparatus for bipolar elimination in silicon-on-insulator (SOI) domino circuit as recited in claim 7 wherein said dynamic circuit includes a dynamic gate circuit, said dynamic gate circuit includes a first field effect transistor connecting said input to said domino silicon-on-insulator (SOI) field effect transistor.

9. Apparatus for bipolar elimination in silicon-on-insulator (SOI) domino circuit as recited in claim 8 wherein said dynamic gate circuit includes a second field effect transistor connected between said first field effect transistor and ground.

10. Apparatus for bipolar elimination in silicon-on-insulator (SOI) domino circuit as recited in claim 7 wherein said dynamic circuit includes a dynamic buffer circuit.

11. Apparatus for bipolar elimination in silicon-on-insulator (SOI) domino circuit as recited in claim 10 wherein said dynamic buffer circuit includes a domino logic block.

12. Apparatus for bipolar elimination in silicon-on-insulator (SOI) domino circuit as recited in claim 2 wherein said precharging device is turned off during an evaluate mode of said domino circuit.

* * * * *